(12) United States Patent
Mohamed

(10) Patent No.: US 7,891,937 B2
(45) Date of Patent: Feb. 22, 2011

(54) ADJUSTABLE WIDTH CASSETTE FOR WAFER FILM FRAMES

(75) Inventor: Zainudin Bin Mohamed, Selangor (MY)

(73) Assignee: Texas Instruments Incorporated, Dallas, TX (US)

( * ) Notice: Subject to any disclaimer, the term of this patent is extended or adjusted under 35 U.S.C. 154(b) by 1876 days.

(21) Appl. No.: 10/452,341

(22) Filed: Jun. 2, 2003

(65) Prior Publication Data

US 2004/0240974 A1 Dec. 2, 2004

(51) Int. Cl.
*A47G 19/08* (2006.01)
(52) U.S. Cl. .................................................. 414/810
(58) Field of Classification Search ............... 414/810
See application file for complete search history.

(56) References Cited

U.S. PATENT DOCUMENTS

| | | | | |
|---|---|---|---|---|
| 4,385,781 A | * | 5/1983 | Welsch et al. ............... 294/161 |
| 5,593,046 A | * | 1/1997 | Katsuura et al. ........... 211/41.15 |
| 6,155,426 A | * | 12/2000 | Matsuda et al. .............. 206/708 |
| 6,328,169 B1 | * | 12/2001 | Matsuda et al. ........... 211/41.17 |
| 6,814,690 B1 | * | 11/2004 | Stearns .......................... 482/52 |
| 7,240,885 B1 | * | 7/2007 | Sullivan .................... 248/354.1 |
| 2004/0134831 A1 | * | 7/2004 | Huang et al. ................. 206/711 |
| 2004/0222126 A1 | * | 11/2004 | Chen et al. ................... 206/710 |

* cited by examiner

*Primary Examiner*—Charles A Fox
(74) *Attorney, Agent, or Firm*—Yingsheng Tung; Wade J. Brady, III; Frederick J. Telecky, Jr.

(57) ABSTRACT

An expandable width cassette for storing and transporting thin planar objects of different widths is provided. The cassette 10 includes two side panels 12 of fixed height opposite and parallel to one another having a series of elongated slots on the inner surface of the side panels for supporting planar objects, a sliding bar assembly 13 on the bottom side of the cassette, and an adjustable length panel 14 on the top side of the cassette. Spring loaded press screws 143 disengaged from locator holes at predefined locations in the top panel allow the cassette width to be altered by pushing or pulling the side panels. A wafer film frame cassette includes a back stop mechanism which further serves to align with a frame notch.

2 Claims, 6 Drawing Sheets

ADJUSTABLE WIDTH CASSETTE FOR WAFER FILM FRAMES

FIELD OF THE INVENTION

The invention relates generally to semiconductor processing equipment, and more particularly to cassettes for wafers on film frames.

BACKGROUND OF THE INVENTION

The semiconductor industry, as well as unrelated industries, frequently hold and transfer thin planar objects in cassettes having a series of parallel, spaced apart horizontal slots which receive and hold a single planar object in each slot. Semiconductor wafers are frequently transferred from one processing station to another via cassettes. In some cases, cassettes are sized and shaped to hold film frames or other similar devices upon which a wafer has been mounted for processing and/or transporting.

Cassettes are used within the semiconductor industry primarily in processes which retrieve and process one wafer at a time. In particular, wafer cassettes are often used in conjunction with chemical mechanical planarization machines and in the packaging and assembly operations film frame cassettes are used in conjunction with sawing and die attach equipment. Wafers or the film frames upon which wafers have been mounted are typically loaded and unloaded from a cassette automatically by the processing equipment or a robotic mechanism. A robotic arm selectively retrieves the wafer or frame from the cassette, and transports the work pieces one at a time to a processing station. In the case of film frame cassettes, the frames are individually removed for processing, usually by an automated load/unload interface device on sawing or die attach equipment, and it is necessary that the frames be aligned and positioned in the correct location to avoid malfunction of the interface device.

The diameter of wafers has changed several times in recent years as larger wafers and processing equipment for larger diameter wafers has become available to the industry, and as the economics of larger diameter wafers has become evident. It is not uncommon for backend facilities, including packaging and assembly manufacturing to process wafers of more than one diameter, typically 150, 200, 250, and 300 mm. In order to hold the wafers and frames securely in place, each cassette is sized to accommodate a given wafer and/or film frame size. Therefore, the manufacturing facilities which store and transport wafers or wafers on film frames must store various frame and cassette sizes, and must make changes to the processing equipment or transport equipment for each different size wafer or frame. Typically, a cassette for each specific wafer size differs in width, height, depth, and other design features from a cassette for a different size wafer. The multiplicity of cassette sizes adds to storage space requirements, as well as inventory cost.

Modifications to automated equipment or equipment interfaces in order to facilitate different wafer and frame sizes result in costly work stoppages and increased cycle time. Equipment changes, particularly those involving mechanical modifications to interface mechanisms are labor intensive, time consuming, and are subject to set-up errors.

A significant problem associated with multiple cassette sizes requiring equipment set-up changes is the increased probability of improper alignment resulting in damage to costly wafers as a result of frames jamming into each other and sliding across the surface of a wafer.

Industries unrelated to semiconductors have similar issues with a multiplicity of cassette sizes; therefore, it would be an advantage not only to the semiconductor industry, but to unrelated industries as well, if a solution to the problems associated with cost of multiple cassette sizes, the equipment changes, and preparation required for handling multiple cassette sizes could be eliminated.

SUMMARY OF THE INVENTION

In accordance with an embodiment of the invention, a cassette which may be expanded or contracted in width for storing and transporting thin planar objects of different widths is provided. A first embodiment of the adjustable width cassette includes two side panels of fixed height opposite and parallel to one another having a series of elongated slots on the inner surface of the side panels for supporting the objects along a portion of the perimeter, an expandable sliding bar assembly on the bottom side of the cassette contacting and joining the side panels, and an adjustable length panel on the top side of the cassette having spring loaded press screws with holes for screw engagement at predefined locations.

The front of the cassette is open to allow objects to be inserted into the cassette and to be supported on the side slots. Preferably, the depth and height of the cassette are a function of the side panels and are fixed. A stop mechanism is provided on the cassette backside to prevent the planar objects from escaping, or from extending outside the cassette. The stop mechanism extends along one side of the back, and has no connection between the two side panels. The adjustable width cassette is preferably comprised of a lightweight durable material such as a machined metal or a molded plastic.

The adjustable length panel on the cassette top includes a base plate having a slot with a plurality of locator holes and is attached to the side panels by brackets. The panel further includes a screw frame having spring loaded screws which may be depressed to disengage from locator holes in the base plate. The holes effectively form stop positions and are placed at predefined locations along the length of the plate to permit the cassette width to be changed.

The spring loaded press screws include a screw having a head larger in diameter than the body, and a spring wound around the body. The springs have sufficient recoil strength to disengage from locator holes when pressed and released.

Use of the adjustable width cassette is accomplished by pressing to disengage the screw(s), the frame is then free to move along the slot in the base plate, the side panels may be pulled apart until a new locator hole is encountered, and the screws become reengaged to form a wider cassette. Alternately, the press spring loaded screws may be depressed to become disengaged from the locator holes and the sides pushed together until an inner stop position is encountered for a smaller width cassette.

A sliding bar assembly on the bottom of the cassette includes a two part frame with a sliding bar, and a rigid cover. The sliding mechanism is controlled by movement of the top side adjustable length panel.

In an embodiment wherein the adjustable width cassette is a wafer film frame holder, the cassette includes a rod of approximately the same height as the side panels positioned on the back side of the cassette. The rod is held by a pair of brackets extending from one of the side panels, and is positioned to mate with the notch in a given film frame, thereby forming both a stop mechanism to preclude frames from extending beyond the cassette back side, and an alignment feature to insure correct frame orientation. The brackets are placed near the top and bottom of the cassette. The rod may be placed in a second set of brackets of a different length for a different frame size.

An adjustable width cassette for semiconductor wafers includes more narrow slots than a cassette for film frames, and the backstop mechanism is of a material sufficiently compliant to avoid chipping or damage to brittle wafers, such as a molded plastic.

In accordance with other embodiments of the invention, the adjustable width cassette is applicable to various thin planar materials of different widths which require horizontal storage and or transporting, and is not limited to the semiconductor industry The expandable width cassette of this invention reduces the amount of storage space required in a manufacturing facility for multiple fixed width cassettes, reduces inventory costs, reduces equipment set-up time, and minimizes errors associated with use of different single width cassettes.

DETAILED DESCRIPTION OF THE INVENTION

Figure 1:
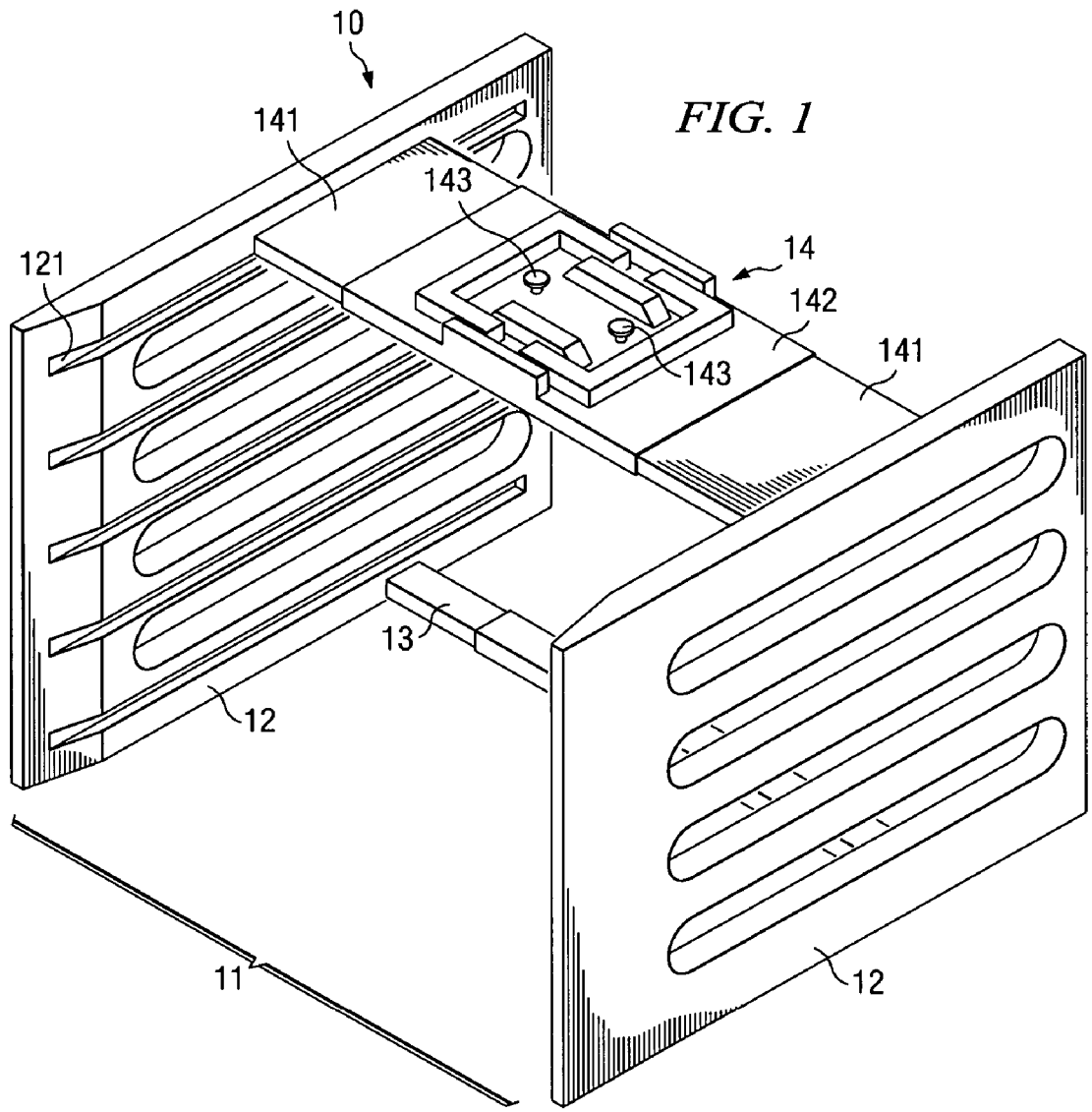
FIG. 1 is a perspective view of an embodiment of the adjustable width cassette of the current invention.

FIG. 1 provides a perspective view of a first embodiment of the invention, an adjustable width cassette 10 for holding and transporting planar objects. The cassette 10 includes a substantially open front facing side 11 to allow insertion of thin, planar objects, a pair of vertical side panels 12 opposite and parallel to each other having a plurality of elongated opposing horizontal slots 121 on the inner surface for supporting the planar members, a sliding bar assembly 13 on the bottom side of the cassette providing connection between the side panels 12, and an adjustable length horizontal panel 14 on the top side of the cassette providing connection between the side panels 12. The horizontal structures, a sliding bar assembly 13 on the bottom and the adjustable length panel 14 on the top, are approximately centered front to back of the cassette in order to provide dimensional stability to the vertical side panels 12.

Figure 2:
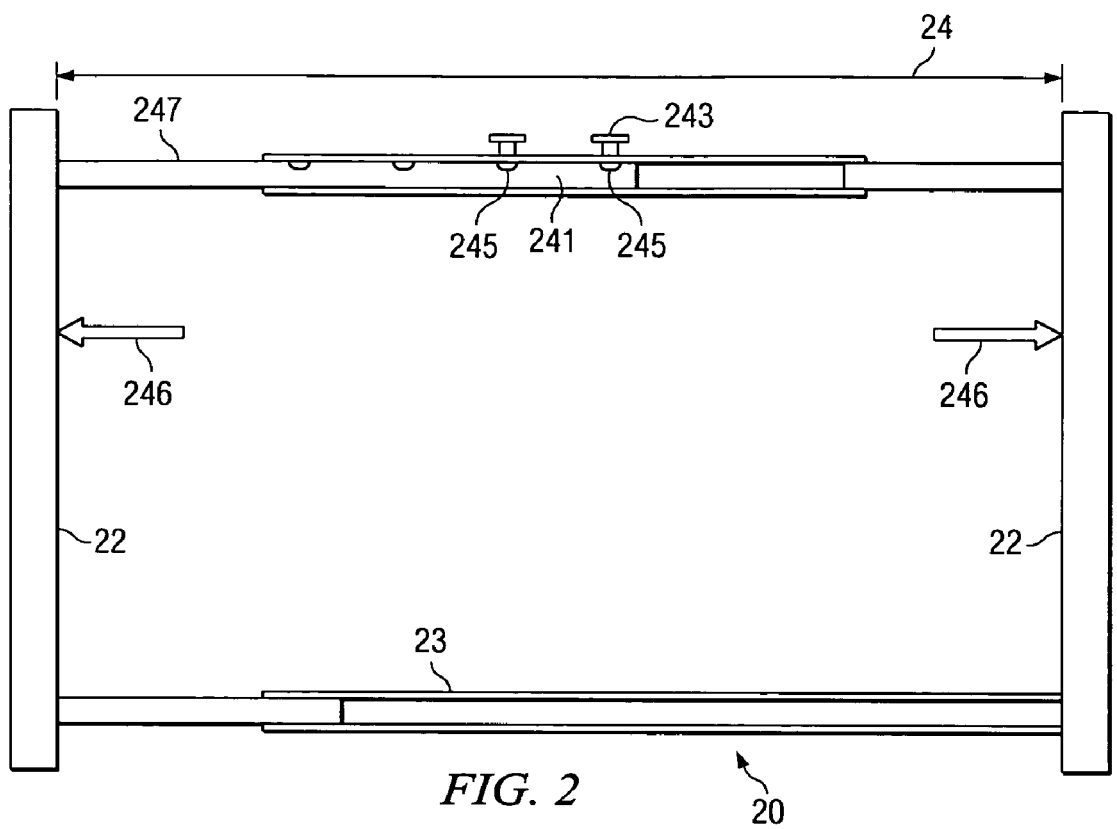
FIG. 2 schematically demonstrates the adjustable width cassette in an expanded mode.

The adjustable length panel 14 on the cassette top side is an assemblage which includes the significant elements to permit adjustment and fixing of the cassette width. The panel assemblage 14 includes a rigid plate 141 having a slot with locator holes (hidden from view) connected to each of the vertical side panels 12 by brackets 247 as shown in FIG. 2 on which the plate may move, and a screw frame 142 atop and near the center of the assemblage and having spring loaded press screws 143 which mate with locator holes at predefined locations. Locator holes are spaced along the length of the plates 141 to engage the screws 143 and fix each predetermined cassette width.

The spring loaded press screws include a screw having a head larger in diameter than the body, and a spring wound around the body. The springs have sufficient recoil strength to disengage from locator holes when pressed and released.

FIG. 2 schematically illustrates the mechanism whereby the width of the cassette 20 is increased. Spring loaded press screws 243 in the adjustable length top panel 24 are moved vertically by pressing and releasing; recoil of the spring engages the screw head causing the screw to disengage from locator holes 245 in the base plate 241, thereby freeing the plate for lateral movement on the brackets 247. With the screws disengaged from the locator holes, side panels 22 of the cassette may then be pulled laterally, as indicated by arrows 246, until a more widely spaced set of locator holes are encountered, and the spring loaded screws become reengaged with the new locator holes. In the same expansion step, the slide bar 23 on the cassette bottom side is expanded lengthwise, thus providing a bottom support for a wider cassette.

Figure 3:
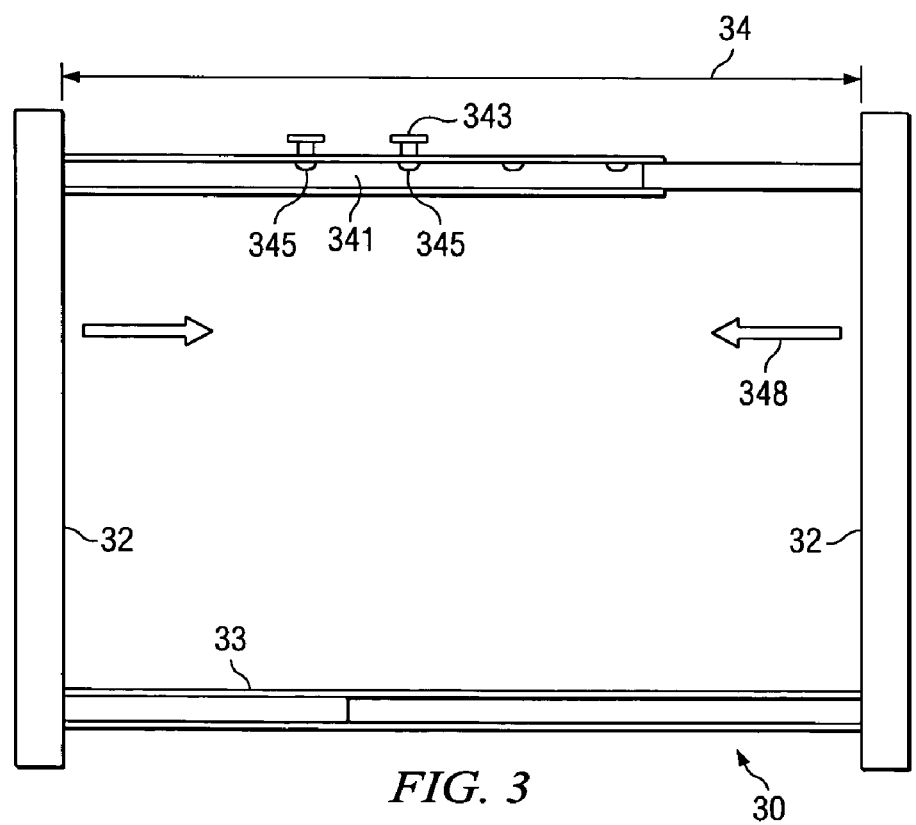
FIG. 3 schematically demonstrates the cassette in a fully contracted position.

Alternately, to form a more narrow cassette 30 as shown in FIG. 3, the press spring screws 343 are moved vertically until they become disengaged from locator holes and the cassette sides 32 are then pushed inwardly, as indicated by arrows 348, until a different set of locator holes 345 within the slot in the plate 341 are encountered and engaged. The slide bar 33 on the bottom follows the width set by the top side adjustable length panel 34.

Figure 4A:
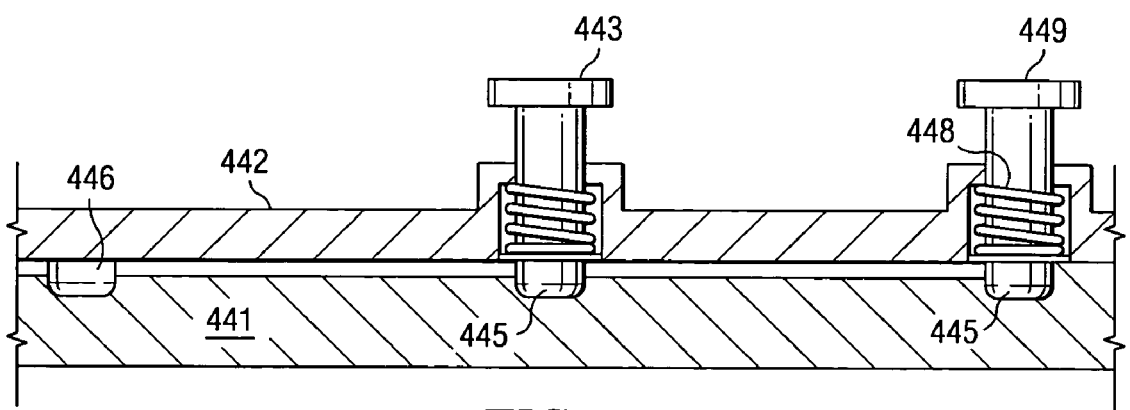
FIG. 4a is a detailed cross sectional view of a portion of the adjustable length panel including the screw frame, spring loaded screws, and locator holes in the base plate.

In FIG. 4a, a cross section of a portion of the adjustable length panel assemblage including the screw frame 442 further illustrates the mechanism for adjusting the cassette width. A pair of spring 448 wound screws 443 having heads 449 larger in diameter than the screw body is set in the screw frame 442. Each of the screws 443 is engaged with a mating locator hole 445 in a plate 441. It can be seen that a different set of holes 446 are included in the plate and the holes are set equidistant from each other so that the screws 443 may be engaged with a different pair of holes, thus allowing a different width of cassette to be formed when the screws are released and the cassette side panels are pushed apart or together.

Figure 4B:
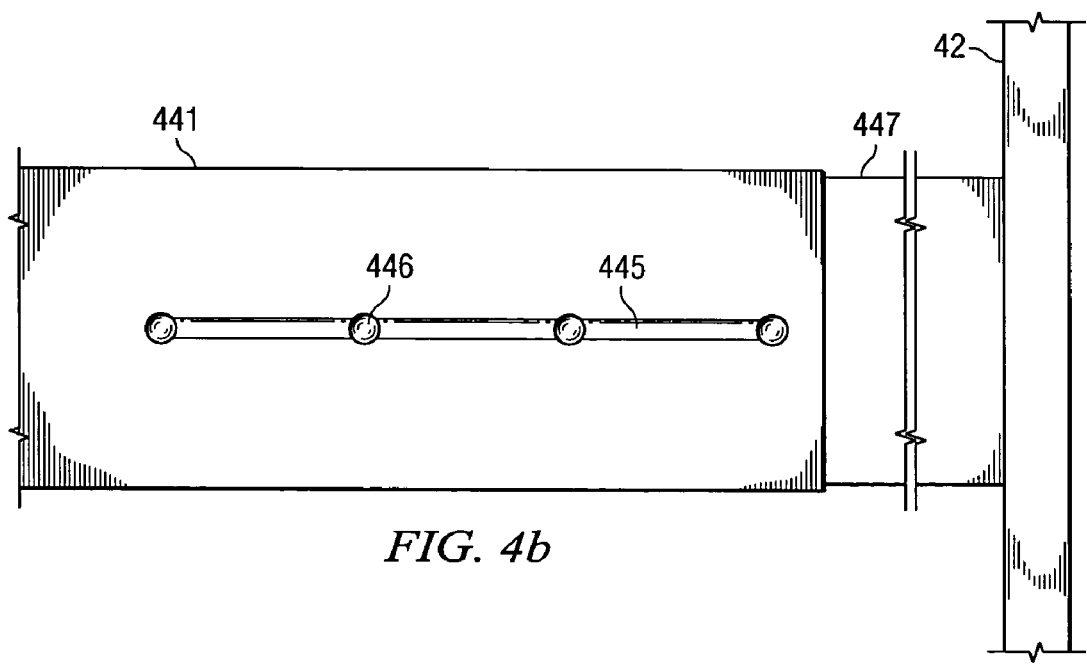
FIG. 4b is a detailed top view of the slot and holes in the base plate.

In FIG. 4b, a top view of the base plate 441 illustrates the slot 445 in the plate with enlarged holes 446 which may engage the screws and form a stop position. The base plate 441 slides on the brackets 447 which are connected to the side panels 42.

A pair of screws with mating holes has been illustrated in FIG. 4a; however, in an alternate embodiment having a different panel width, the number of screws and holes placed along the length of the panel may be increased or decreased.

Figure 5A:
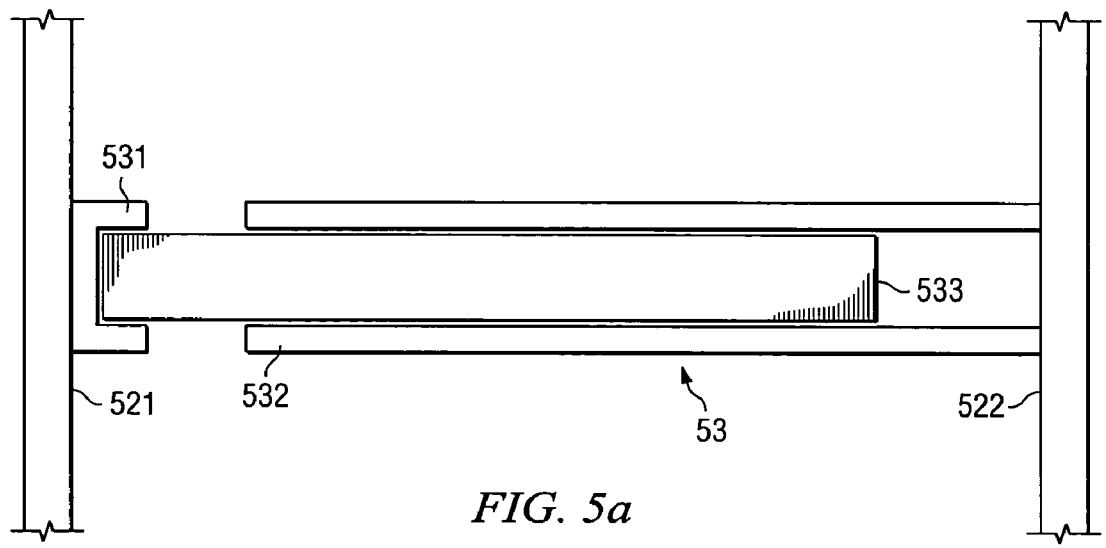
FIG. 5a is a top view of the sliding bar assembly in the bottom of the cassette.
Figure 5B:
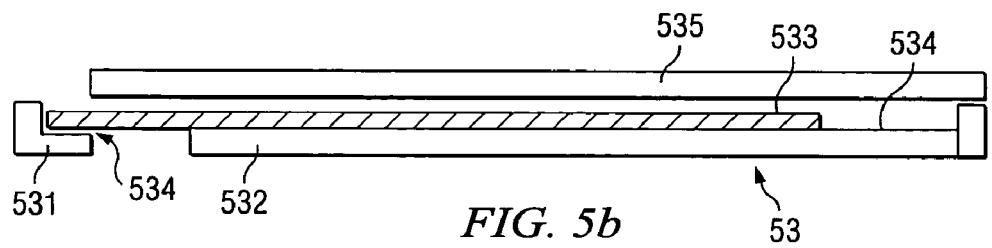
FIG. 5b is a cross sectional view of the sliding bar assembly.

In FIGS. 5a and 5b, the sliding bar assembly 53 on the bottom of the cassette connects the two vertical side panels 521,522, and the assembly 53 comprises two major components. The first component is a frame having two sections 531 and 532 with a sliding bar 533, and the second component, a rigid cover. The two section frame 531, 532 is shown from a top view in FIG. 5a and a cross sectional view in FIG. 5b. The frame includes a smaller section 531 which is attached to one cassette side 521, and a larger section 532 on which the bar 533 slides is attached to the opposite cassette side panel 522. In FIG. 5b, the frame sections 531,532 include a recess 534 equal to or greater than the thickness of the sliding bar 533. The sliding bar 533 is positioned and moves within the recess 534 in the frame sections 531,532.

The length of the cover 535 is equal to the shortest distance to which the inner sides of the cassette can be set, and thereby the cover may form a hard stop for cassette minimum width. The length of the bottom sliding assembly 53 is established by the adjustable length panel on the cassette top side, and the bottom sliding assembly 53 acts as a slave.

In a preferred embodiment, the depth and height of the cassette are a function of the side panels and are fixed.

A stop mechanism is provided on the cassette backside to prevent the planar objects from escaping, or from extending outside the cassette. Because the cassette width is variable, it is desirable that a stop for the backside be attached to one or both sides, but that there be no connection between the cassette sides which could interfere with the width adjustment. The back stop may be a solid or perforated element of sufficient length to preclude objects being stored from extending beyond the cassette. Preferably, the back stop will extend from one side panel between the top and bottom.

In an embodiment of the adjustable width cassette to be used for holding semiconductor wafers comprising a brittle material such as silicon, the back stop material is of sufficiently compliant material to prevent chipping the wafer edges. A polymeric material such as Teflon™ or a silicone is preferred.

The adjustable width cassette preferably comprises a lightweight durable material such as a machined metal or a molded plastic.

In a second embodiment, the adjustable width cassette is a film frame holder for storing and transporting semiconductor wafers. A film frame holder is typically used to position and secure a wafer on tape by a controlled release adhesive during the processes of sawing the wafer into individual chips, transporting the frame with sawed wafer to a pick and place equipment, and aligning the wafer in a pick and place equipment.

Figure 6:
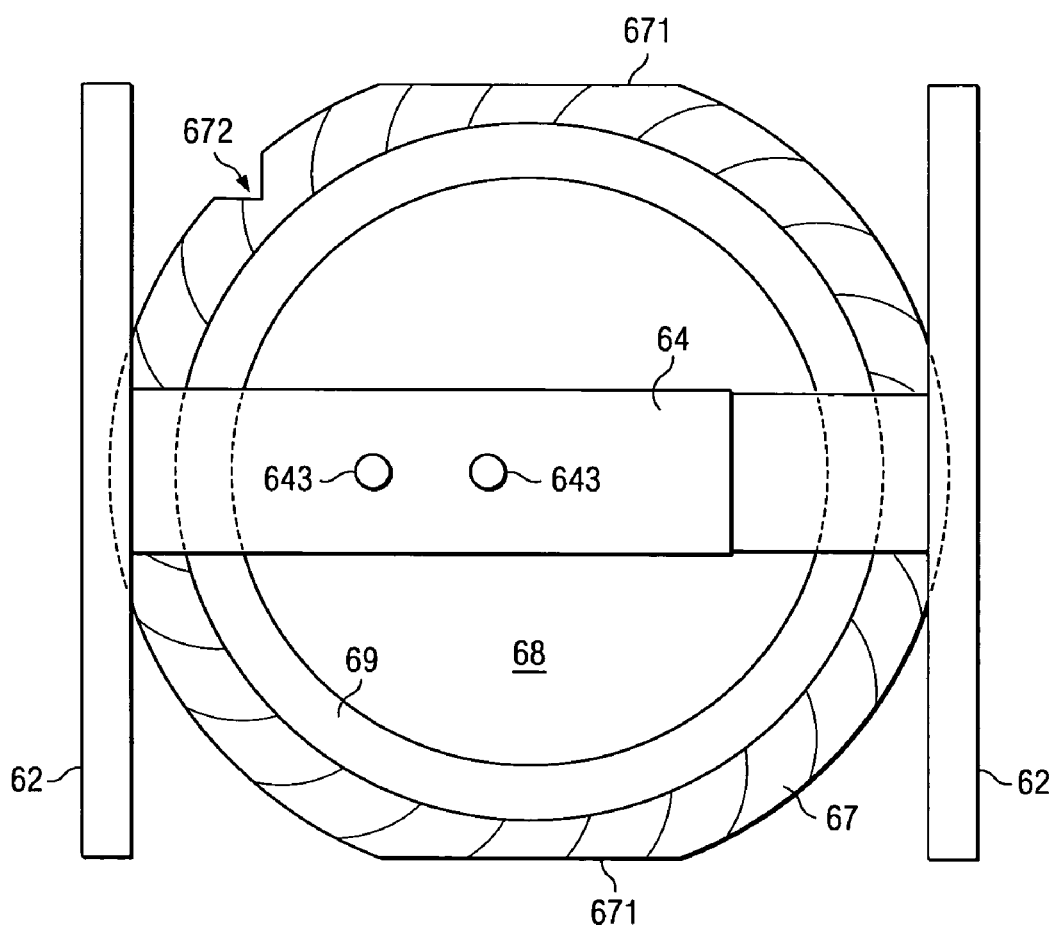
FIG. 6 is a top view of a film frame and wafer in the adjustable width cassette.

In FIG. 6, a top view of the adjustable width cassette 60 is shown with a film frame 67 having a semiconductor wafer 68 adhered to a support film 69. Curved sides of the frame 67 rest on slots in opposite side panels 62 of the cassette. The film frame 67 is typically fabricated with flat sides adjacent to the curves sides. Spring loaded screws 643 in the top panel 64 engage in holes at predefined locations to secure the cassette width for the selected frame and wafer width.

Diameter of the wafer 68 is a major determining factor in the film frame 67 dimension. The film area 69 within the frame is larger than the wafer 68 in order to avoid damage to a dicing saw blade if it were to encounter the rigid metal frame. However, it is preferable that the frame size and requisite cassette size be as small as the wafer permits in order to avoid the need for excessive factory storage space.

The frame 67 has one or two flat sides 671 for correct alignment to the cassette and to provide a surface which does not extend beyond the cassette front and back sides. The frame further includes at least one notch 672 for alignment at the pick and place equipment.

The adjustable width cassette as shown in FIG. 1 may be used to support and transport thin planar objects, such as wafers, disks, plates, or a number of other objects. For different types of objects to be handled, the back side of the cassette may require alternate stop mechanisms to control the objects from being pushed through and out the back side of the cassette. In the embodiment as a film frame cassette, the preferred stop mechanism on the back side serves dual purposes (1) of precluding frames from escaping through the back side, and (2) of aligning the notch in the frame so that correct orientation of the wafer is assured.

Figure 7A:
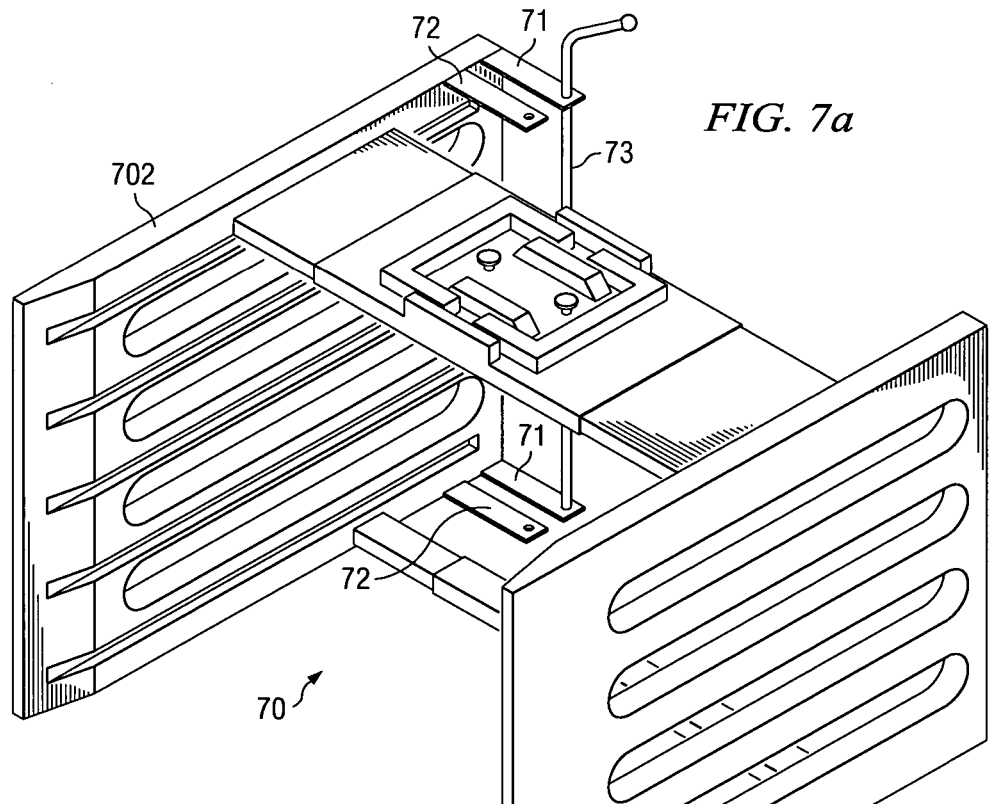
FIG. 7a illustrates an expandable width cassette with film frame back stop rod and brackets.
Figure 7B:
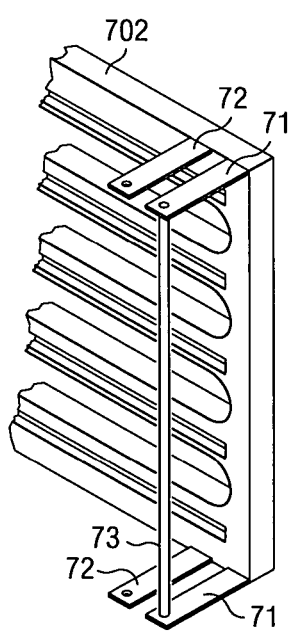
FIG. 7b illustrates in more detail a portion of a side panel with two pairs of brackets for a back stop rod.

In FIG. 7a, the cassette 70 includes two sets of brackets 71 and 72 extending inwardly from one side panel 702, and a rod 73 of approximately the same height as the side panel connecting the two components of one bracket set 71. A more detailed view of the back stop rod arrangement for a film frame cassette is shown in FIG. 7b. Each set of brackets 71 and 72, include two components, one of which is positioned near the top and the second near the bottom of the cassette. Components of the bracket set placed closer to the back 71 of the cassette are longer than those of the set of bracket moved more toward the center, and are located so that the rod 73 will engage the notch of a larger film frame. A smaller diameter film frame will be engaged by a rod in the shorter bracket, and a larger diameter frame by a rod positioned in the longer bracket set. The rod may be moved manually to the desired location. Because the brackets and rod are attached to a single side 702 of the cassette, there is no interference with the cassette width adjustment mechanisms.

Figure 8:
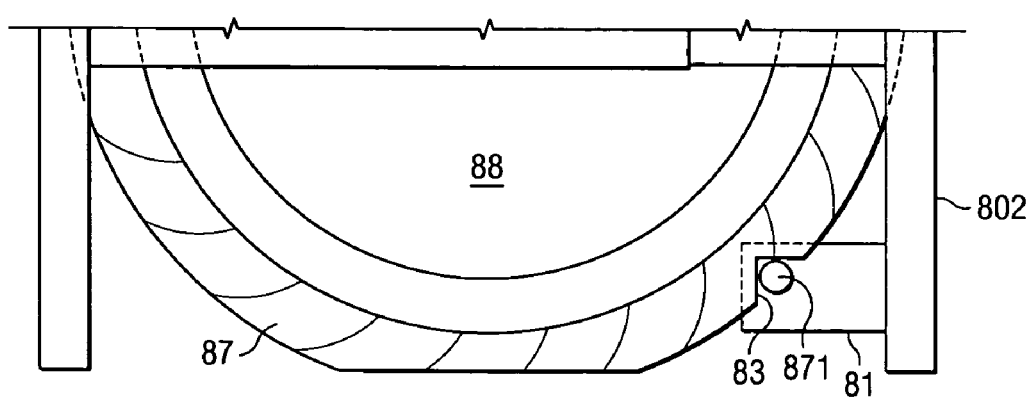
FIG. 8 is a top view of a film frame notch engaged with a back stop rod.

In FIG. 8 from the top view, a film frame 87 with wafer 88 is positioned on a slot in the cassette side panel 802. The rod 83 extending through a bracket 81 has engaged the notch 871 in the frame 87 causing it to stop. Precise alignment of the film frame and wafer is a significant asset for automated pick and place equipment. The equipment typically has a programmed location on the wafer to begin removing the chips from the wafer tape, and that location must be correct in order to avoid selecting the wrong chips.

This back stop and frame alignment feature has been illustrate with two locations, however, it is not limited to two sizes of frames, but additional brackets may be included.

Width adjustment of the film frame cassette makes use of the same adjustable length panel on the top side and sliding bar assembly as shown in FIGS. 2 through 5, and the method for expanding and contracting the width is the same as previously described.

The adjustable width cassette provides a transport and storage case useful for a number of planar objects wherein the objects are of different widths. Preferably, the height and depth of the cassette are fixed, thereby eliminating much of the work required to adjust equipment interface systems for cassettes having not only different width, but also different height and depth. The adjustable width cassette reduces the amount of storage and inventory of cassettes required for a factory which supports processing of multiple sized planar objects.

In an embodiment of a cassette for film frames and wafer, the frames are typically constructed of a metal such as aluminum or a steel alloy, and therefore the preferred materials for the film frame cassette are of a light weight, durable, rigid material such as an aluminum alloy. In an alternate embodiment, the cassette may be constructed of a molded plastic of sufficient structural strength to withstand expansion and contraction.

It will be recognized that an adjustable width cassette is applicable for transport and storage of many types of objects, and that modifications for various applications will become apparent to those skilled in the art. Therefore, it is intended that the appended claims be interpreted as broadly as possible.

What is claimed is:

1. A method for holding and transporting thin planar objects, comprising the steps of:
   providing a cassette, said cassette comprising:
   a substantially open front side;

two side panels positioned opposite and parallel to each other with a plurality of elongated opposing slots extending horizontally along the inner surface of each of said side panels for supporting thin planar objects along a portion of the perimeter of said objects;

an expandable, sliding bar assembly providing connection between said side panels on the bottom side of the cassette;

an adjustable length panel providing connection between said side panels on the cassette top side; and a spring-loaded locking means for locking the adjustable length panel at one of two predetermined lengths;

providing a thin planar object of a first dimension;

determining that the length of the adjustable length panel setting is suitable for the cassette to holding and transporting a thin planar object of the first dimension; and loading said thin planar object into said open front side of said cassette such that the perimeter of said object is supported by said elongated opposing slots.

2. A method for storing a semiconductor wafer, comprising:

a. providing a cassette, which includes:
  1. a substantially open front side;
  2. two side panels positioned opposite and parallel to each other with a plurality of elongated opposing slots extending horizontally along the inner surface for holding semiconductor wafers;
  3. an expandable, sliding bar assembly connecting the side panels on the bottom side of the cassette; and
  4. an adjustable panel with a spring-loaded lock connecting the side panels on the top side of the cassette, set at a first length;

b. providing a semiconductor wafer of a first diameter;

c. determining that the first length of the adjustable panel is unsuitable for the cassette to store the wafer of the first diameter;

d. applying a force on the spring-loaded lock to release the adjustable length panel from the first-length setting and setting the adjustable length panel to a predetermined second length suitable for storing a wafer of the first diameter;

e. release the force from the spring-loaded lock to lock the adjustable length panel to the second-length setting; and f. placing the semiconductor wafer in the cassette.

* * * * *